United States Patent [19]
Cricchi et al.

[11] Patent Number: 5,559,349
[45] Date of Patent: Sep. 24, 1996

[54] SILICON INTEGRATED CIRCUIT WITH PASSIVE DEVICES OVER HIGH RESISTIVITY SILICON SUBSTRATE PORTION, AND ACTIVE DEVICES FORMED IN LOWER RESISTIVITY SILICON LAYER OVER THE SUBSTRATE

[75] Inventors: James R. Cricchi, Cantonsville; Paul A. Potyraj, Dundalk; Mike L. Salib, Millersville, all of Md.

[73] Assignee: Northrop Grumman Corporation, Los Angeles, Calif.

[21] Appl. No.: 399,802

[22] Filed: Mar. 7, 1995

[51] Int. Cl.⁶ .................................................. H01L 29/80
[52] U.S. Cl. ........................ 257/273; 257/275; 257/277; 257/539
[58] Field of Search ..................... 257/586, 259, 257/275, 276, 277, 662, 664, 728, 273, 539, 528; 333/247, 250

[56] References Cited

U.S. PATENT DOCUMENTS 5,268,315   12/1993   Prasad et al. .............................. 437/31
5,449,953   9/1995   Nathanson et al. ....................... 257/728

OTHER PUBLICATIONS

Taub et al., "Silicon Technologies Adjust to RF Applications", Microwaves & RF . . . , Oct. 1994, pp. 60–74, at p. 67.

Hanes et al., "MICROX—An All-Silicon Technology for Monolithic Microwave Integrated Circuits", IEEE Electron Devices Letters, vol. 14, No. 5, May 1993, pp. 219–221.

*Primary Examiner*—Minhloan Tran
*Attorney, Agent, or Firm*—C. O. Edwards

[57] ABSTRACT

A silicon microwave monolothic integrated circuit device and method of fabricating having a high resistivity silicon substrate with a masking layer of low temperature silicon oxide, silicon nitride and polysilicon sublayers on a first area, and an epitaxial layer over the surface of the silicon substrate in a second area. The active devices are formed over the second area and the passive devices are formed over the first area.

5 Claims, 7 Drawing Sheets

SILICON INTEGRATED CIRCUIT WITH PASSIVE DEVICES OVER HIGH RESISTIVITY SILICON SUBSTRATE PORTION, AND ACTIVE DEVICES FORMED IN LOWER RESISTIVITY SILICON LAYER OVER THE SUBSTRATE

BACKGROUND OF THE INVENTION

1. Field of the Invention

The present invention relates to semiconductor integrated circuit devices, and more particularly to silicon microwave monolithic integrated circuit devices and fabrication process.

2. Description of Related Art

The development of Silicon Microwave Monolithic Integrated Circuit (SiMMIC) devices has been limited due to an inability to integrate high Q inductors, transformers, and transmission lines with high frequency silicon bipolar junction transistors (BJTs). The fabrication of high frequency BJTs requires a silicon substrate or silicon epitaxial layer having a low resistivity, such as 1 to 10 ohm-cm. Unfortunately, when microstrip inductors, transformers, and transmission lines are incorporated with a low resistivity silicon substrate or silicon epitaxial layer, the resulting losses at high frequencies are unacceptable for the design of microwave transceivers. Thus, it has not been practical to integrate both high frequency BJTs and microstrip inductors, transformers and transmission lines in an SiMMIC device. Nevertheless, a low-loss SiMMIC device is highly desirable for UHF, L-Band, and S-Band transceivers because established large diameter silicon wafers and high yield batch processes offer the advantages of low cost and high reproducibility.

SUMMARY OF THE INVENTION

In light of the foregoing, the present invention is directed to a low-loss SiMMIC device.

In another aspect, the present invention is directed to a process for fabricating a low-loss SiMMIC device.

Additional features and advantages of the invention will be set forth in part in the description that follows, and in part will be apparent from the description, or may be learned by practice of the invention. The objects and advantages of the invention will be realized and attained by the device and process particularly pointed out in the written description and claims hereof, as well as in the appended drawings.

To achieve the advantages of the invention and in accordance with the purpose of the invention, as embodied and broadly described herein, the present invention is a silicon microwave monolithic integrated circuit device comprising a silicon substrate having a first resistivity, a masking layer formed over a first area of the substrate, a silicon epitaxial layer formed over a second area of the substrate, the silicon epitaxial layer having a second resistivity lower than the first resistivity, a microwave bipolar junction transistor (BJT) formed in the silicon epitaxial layer and a portion of the second area of the substrate, and an inductor element formed over the masking layer and the first area of the silicon substrate.

In another aspect, the present invention is a process for fabricating a silicon microwave monolithic integrated circuit device, the process comprising the steps of providing a silicon substrate having a first resistivity, forming a dielectric layer over a first area of the substrate, forming a silicon epitaxial layer over a second area of the substrate, the silicon epitaxial layer having a second resistivity lower than the first resistivity, forming a microwave bipolar junction transistor (BJT) formed in the silicon epitaxial layer and a portion of the second area of the substrate, and forming an inductor element over the dielectric layer and the first area of the silicon substrate.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention and are incorporated in and constitute a part of this specification, illustrate the embodiments of the invention and together with the description serve to explain the principles of the invention.

DETAILED DESCRIPTION OF THE INVENTION

Reference will now be made in detail to the present preferred embodiment of the invention, examples of which are illustrated in the accompanying drawings. Wherever possible, the same reference numbers will be used throughout the drawings to refer to the same or like parts.

In accordance with the present invention, there is provided a silicon microwave monolithic integrated circuit device. There is also provided, in accordance with the present invention, a process for fabricating a silicon microwave monolithic integrated circuit device. The integrated circuit device and fabrication process of the present invention achieve the integration of silicon microwave BJTs with low-loss microstrip inductors, transformers, and transmission lines by forming a low-resistivity silicon epitaxial layer, for the formation of the microwave BJTs, over a high-resistivity silicon substrate, while preserving the high resistivity of the silicon substrate in the region over which the microstrip inductors, transformers, and transmission lines are formed. Thus, the low-resistivity silicon epitaxial layer enables the formation of the silicon microwave BJTs, whereas the high-resistivity silicon substrate serves as a dielectric for the microstrip inductors, transformers, and transmission lines, thereby reducing the losses that otherwise would be generated at high frequencies with a low-resistivity substrate.

Figure 1:
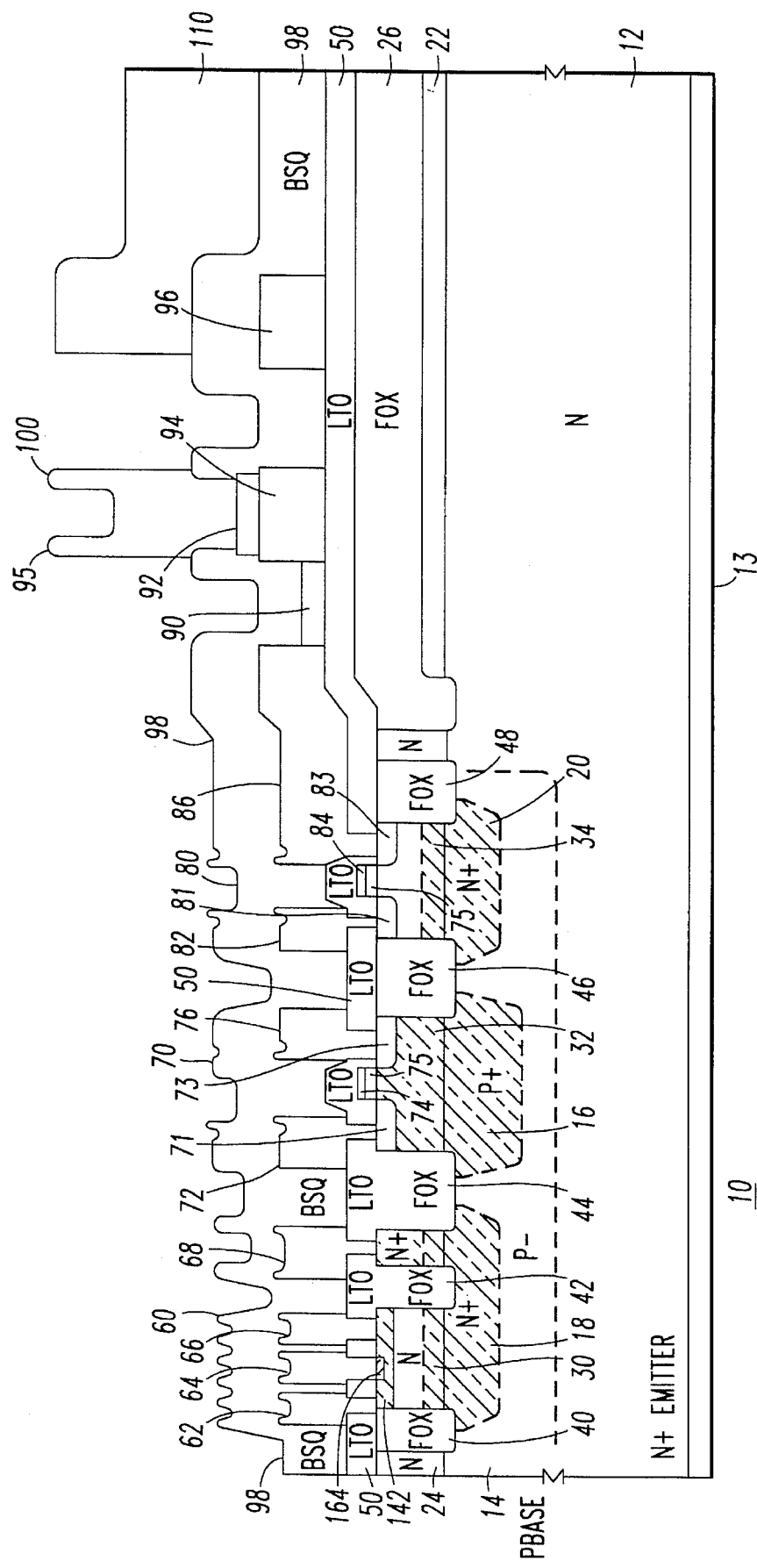
FIG. 1 is an exemplary embodiment of a low-loss SiMMIC in accordance with the present invention.

An exemplary embodiment of the silicon microwave monolithic integrated circuit device of the present invention is shown in FIG. 1, and designated generally by reference numeral 10. The following is an overview of the structure of device 10, with the structure being more fully understood by reference to the process for fabricating the device, to be described. As herein embodied and shown in FIG. 1, SiMMIC device 10 includes a high-resistivity silicon substrate 12 and a backside ground plane 13. A first area of the high-resistivity substrate 12, defined by a masking layer 22, layer 26, and layer 50 which serve as a passive element forming region over which a resistor 90, a capacitor 100, and an inductor element 110 are formed.

A second area of substrate 12, containing an implanted P– well 14, serves as an active element forming region. The P– well 14 contains, an N+ region 18, P+ region 16 and an N+ region 20 for the formation of an NPN microwave BJT 60, an NMOS field-effect transistor 70, and a PMOS field effect transistor 80, respectively. A PNP microwave BJT can be formed in an isolated P– well similar to well 14 with a region similar to 16 in a manner similar to the NPN BJT 60 to provide a complementary NPN/PNP microwave BJT. In the exemplary embodiment shown in FIG. 1, the BJT 60 may serve as a transistor for microwave transmit/receive applications, whereas field-effect transistors 70 and 80 may be configured for CMOS control logic.

The transistors 60, 70, 80 are fabricated using a moderately doped, low-resistivity silicon epitaxial layer 24 formed over the second area of substrate 12. The low resistivity of the silicon epitaxial layer 24 may be in the range of, for example, 0.8 to 10 ohm-cm. The masking layer 22, formed over substrate 12 prior to the formation of epitaxial layer 24, is etched back to define the first area. The layer 22 includes low temperature silicon dioxide (LTO), silicon nitride, and polysilicon sub-layers that prevent the selective single-crystal epitaxial layer 24 from forming over the first area. As a result, the layer 22 also prevents the moderately doped silicon epitaxial layer 24 from doping the high-resistivity substrate 12 in the region over which the passive elements are formed. Thus, the high resistivity of substrate 12 is preserved in the first area, thereby reducing the losses generated in passive elements 90, 100, and 110 during microwave frequency operation.

Figure 2:
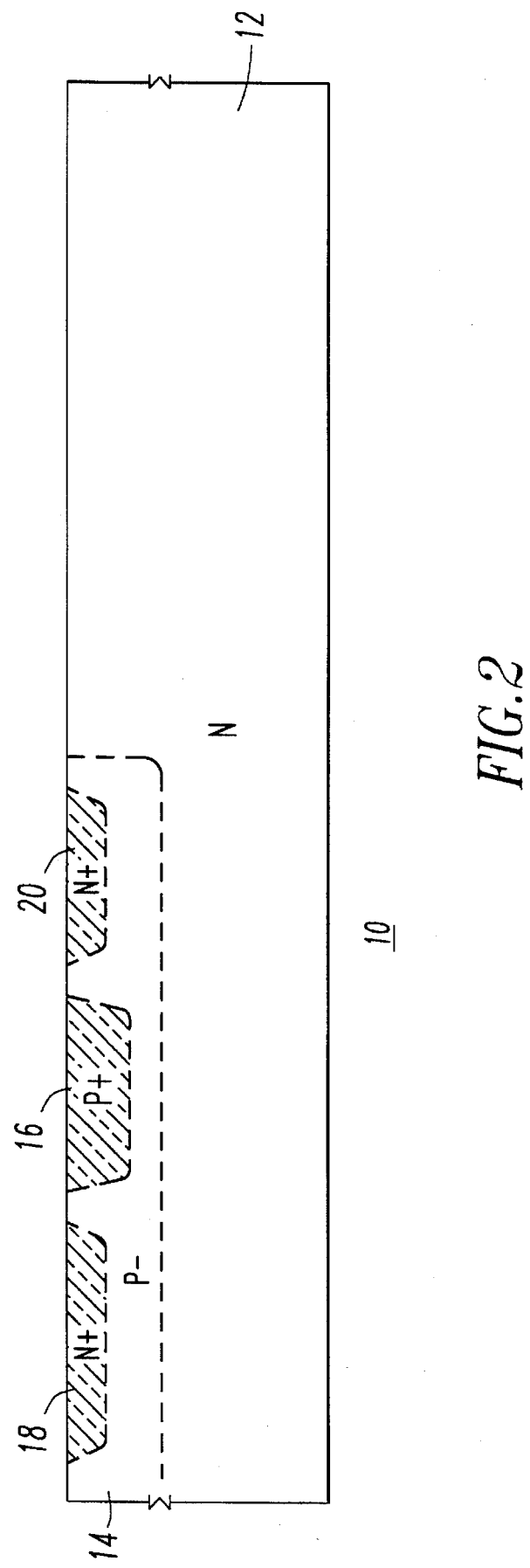
FIGS. 2, 3, 4, 5, 6 and 7 illustrate various stages in a process of manufacturing the low-loss SiMMIC shown in FIG. 1, in accordance with the present invention.

The process of fabricating the SiMMIC device 10 will now be described in detail with reference to FIGS. 2–7. As shown in FIG. 2, the process includes a first step of providing a silicon substrate 12 having a high resistivity. Although FIG. 2 shows an N+ type silicon substrate 12, a P– type silicon substrate could instead be employed. For effective reduction in losses generated by the passive elements to be formed over silicon substrate 12, in accordance with the present invention, a suitable resistivity of silicon substrate 12 would be on the order of 1000 ohm-cm or higher. An oxide nitride mask is used to protect passive areas during oxidation of the P– well drive. The P– well 14 is provided by first applying a resist to the top surface of silicon substrate 12 and exposing the resist with a mask to define the P– well. The P– well 14 is then formed in silicon substrate 12 by ion implantation techniques. For example, the P– well 14 may be formed by implanting Boron ions at an approximate dosage of $2 \times 10^{12}$ and an energy level of approximately 100 keV, followed by drive-in oxidation at a temperature of 1100° C. for sixteen hours.

The N+ regions 18 and 20 are then provided in the P– well by first applying a resist and exposing the resist with a mask to define the N+ regions, and then forming the regions by ion implantation. The N+ regions 18, 20 may each be formed, for example, by the simultaneous implantation of arsenic ions at an approximate dosage of $7 \times 10^{14}$ and an energy level of approximately 130 keV. N+ region 18 forms a subcollector region of the NPN BJT 60 shown in FIG. 1. N+ region 20 serves as a CMOS N+ well for the PMOS field-effect transistor 80 shown in FIG. 1. A P+ region 16 is provided for the CMOS P– well of NMOS field-effect transistor 70 of FIG. 1 and for a subcollector region for a PNP BJT by applying and exposing a resist, and then implanting Boron ions at, for example, a dosage of $4 \times 10^{14}$ and an energy level of 190 keV.

Figure 3:
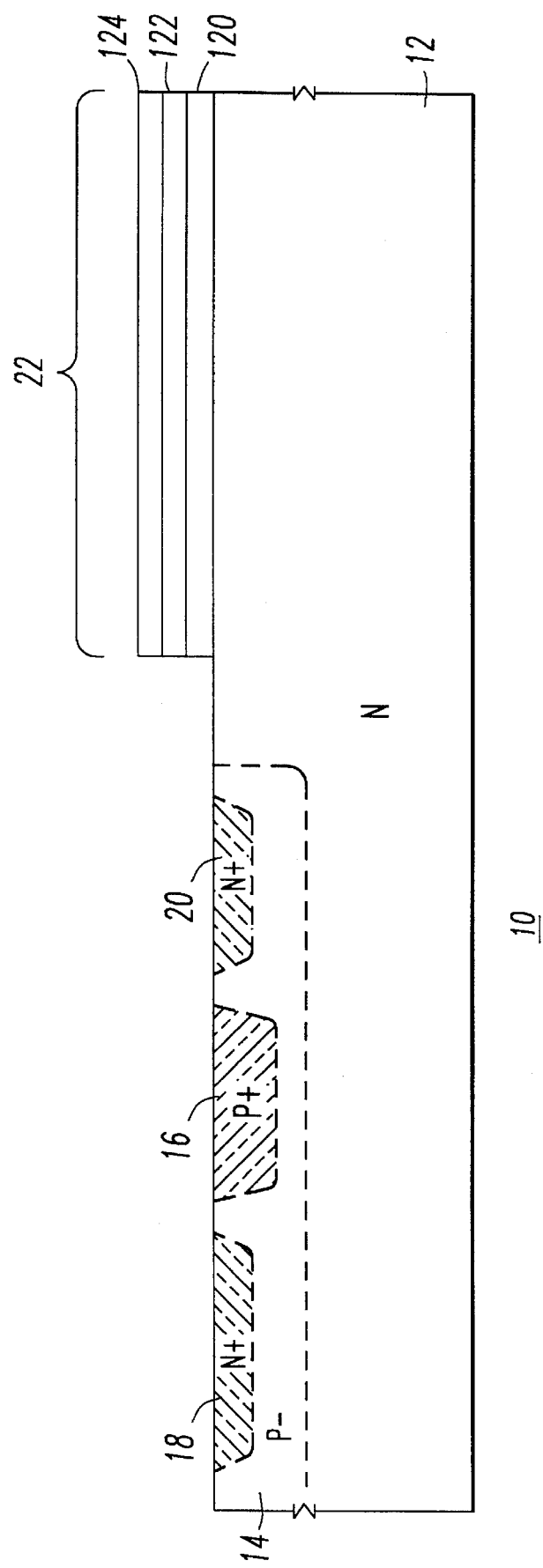
Figure 4:
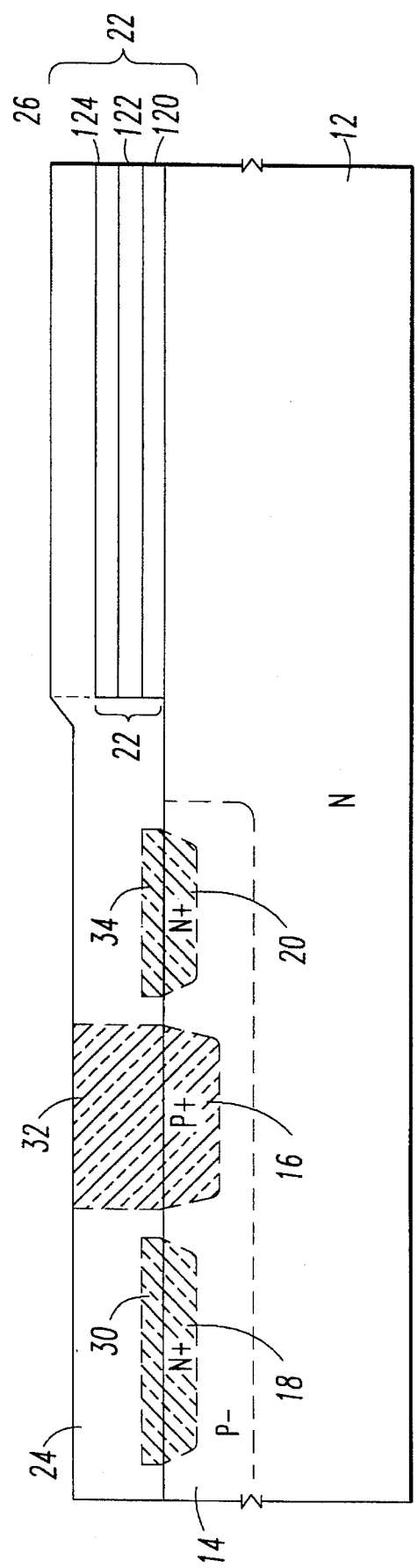

With reference to FIG. 3, layer 22 is formed over the entire surface of silicon substrate 12 by first growing or depositing a low temperature silicon dioxide (LTO) layer 120, followed by the deposition of a layer of silicon nitride 122, and a layer of polysilicon 124. The layer 22 is etched to define the first area of substrate 12 over which a portion of the layer 22 remains, and the second area of silicon substrate 12 providing a window in which the active element forming region resides. As shown in FIG. 4, the low-resistivity silicon epitaxial layer 24 is then formed by deposition over the surface of silicon substrate 12. During the deposition of epitaxial layer 24, out-diffusion operates to extend N+ region 18, P+ region 16, and N+ region 20 into the epitaxial layer 24, forming regions 30, 32, and 34, respectively.

As a result of the etching step, the second area of silicon substrate 12 provides a clean, exposed silicon surface for the deposition of the single-crystal epitaxial layer 24. The polysilicon layer 124 of layer 22 does not afford such a surface, and prevents the formation of the single-crystal epitaxial layer 24 over the first area of the high-resistivity silicon substrate 12. However, the thin polysilicon layer 124 seeds the growth of a continuous polysilicon layer 26 over the edge of the active element forming window and across the entire silicon substrate 12. If the layer 22 is made relatively thin, the step between the silicon epitaxial layer 24 and the polysilicon layer 26 will be relatively small. Thus, there exists good planarity between the top surfaces of the silicon epitaxial layer 24 in which the active elements will be formed, and the polysilicon layer 26 over which the passive elements will be formed. Such planarity facilitates the interconnection of the active and passive elements, and provides a flat SiMMIC device 10.

Figure 5:
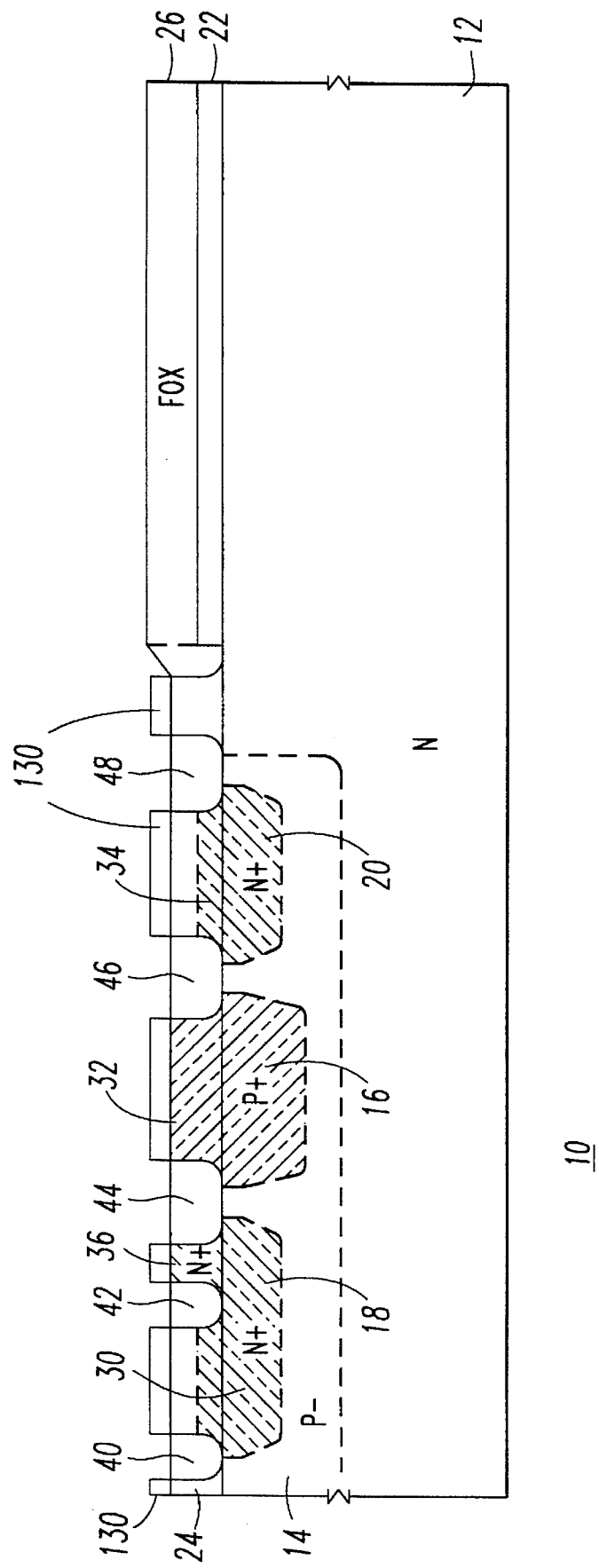

After the polysilicon layer 26 and the silicon epitaxial layer 24 are formed over the first and second areas, respectively, of silicon substrate 12, an N+ sinker contact 36 is ion-implanted in the epitaxial layer 24 above the N+ regions 18 and 30, as shown in FIG. 5. The $N^+$ contact 36 may be implanted, for example, by applying a phosphorous dose of approximately $1 \times 10^{14}$ at an approximate energy level of 75 keV. A layer 130 comprising silicon nitride on top of thermal silicon oxide is then deposited over the silicon substrate 12, patterned and plasma etched along with part of the epitaxial layer 24 and polysilicon 26 to define recessed areas 40, 42, 44, 46, and 48 and the remainder of polysilicon 26 and 124. The recessed areas 40, 42, 44, 46, and 48 are subjected to local oxidation of silicon (LOCOS) field oxidation to isolate the active and passive elements to be formed in subsequent steps of the process of the present invention. The recessed areas 40, 42, 44, 46, and 48 and the remainder of polysilicon 26 and 124 may, for example, be oxidized at an approximate temperature of 950° C. for a period of approximately seven hours. Once the recessed field oxide (FOX) areas 40, 42, 44, 46, 48, polysilicon 26, and 124 are oxidized, the remainder of the nitride/oxide layer 130 can be stripped.

Figure 6:
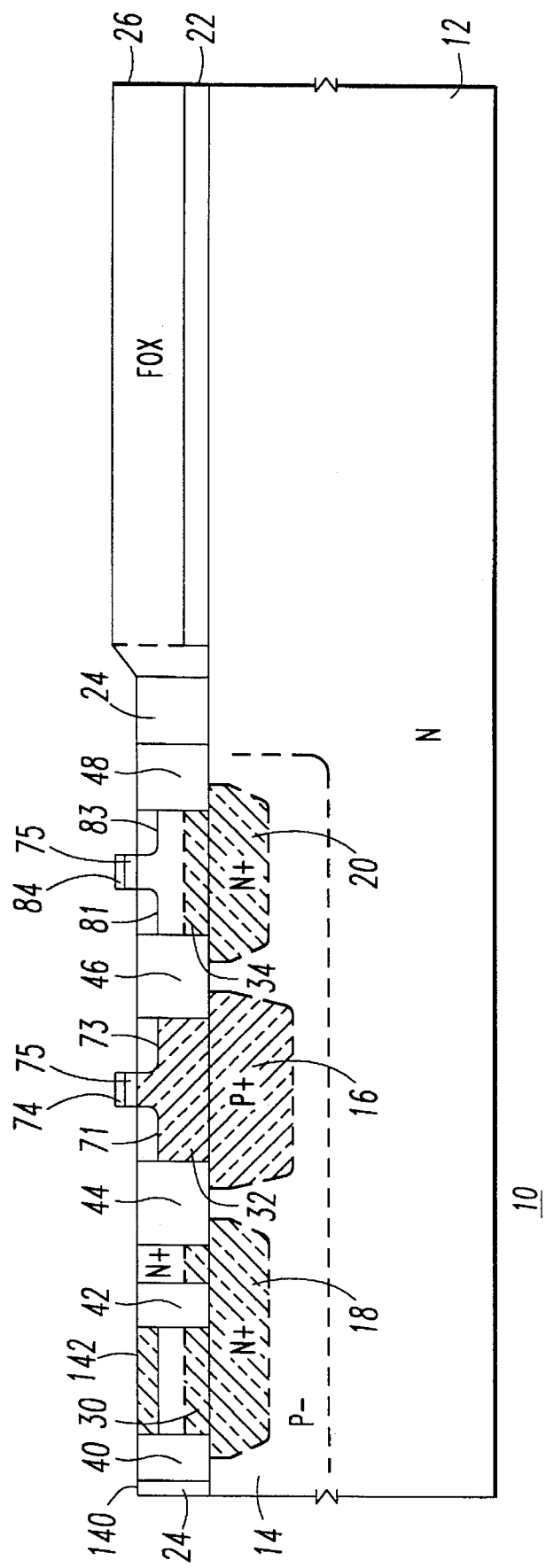

With reference to FIG. 6, a step of gate oxidation is performed to oxidize gate regions 74 and 84 at 75 in the areas above P+ region 32 and N+ region 34, and other exposed silicon regions followed by the deposition of a polysilicon layer over the substrate 12. The polysilicon layer is then doped. The polysilicon layer is etched to define a polysilicon gate 74 above P+ region 32 and a polysilicon gate 84 above N+ region 34. The polysilicon gates 74, 84 form gates for the NMOS field-effect transistor 70 and PMOS field-effect transistor 80, respectively, as shown in FIG. 1. The drain extension of the NMOS field-effect transistor is formed by ion-implantation of an N– LDD (lightly doped drain) region 71 in the P+ region 32. For example, the NLDD region 71 can be formed by the implantation of phosphorous ions at a dosage of $5 \times 10^{13}$ and an energy level of approximately 100 keV. Similarly, a P– LDD region 83 is ion-implanted in the epitaxial layer 24 overlying N+ region 34 to provide a drain for the PMOS field-effect transistor 80. For the P– LDD region 83, Boron ions can be implanted at a dosage of $7.5 \times 10^{13}$ and an approximate energy level of 50 keV.

Figure 7:
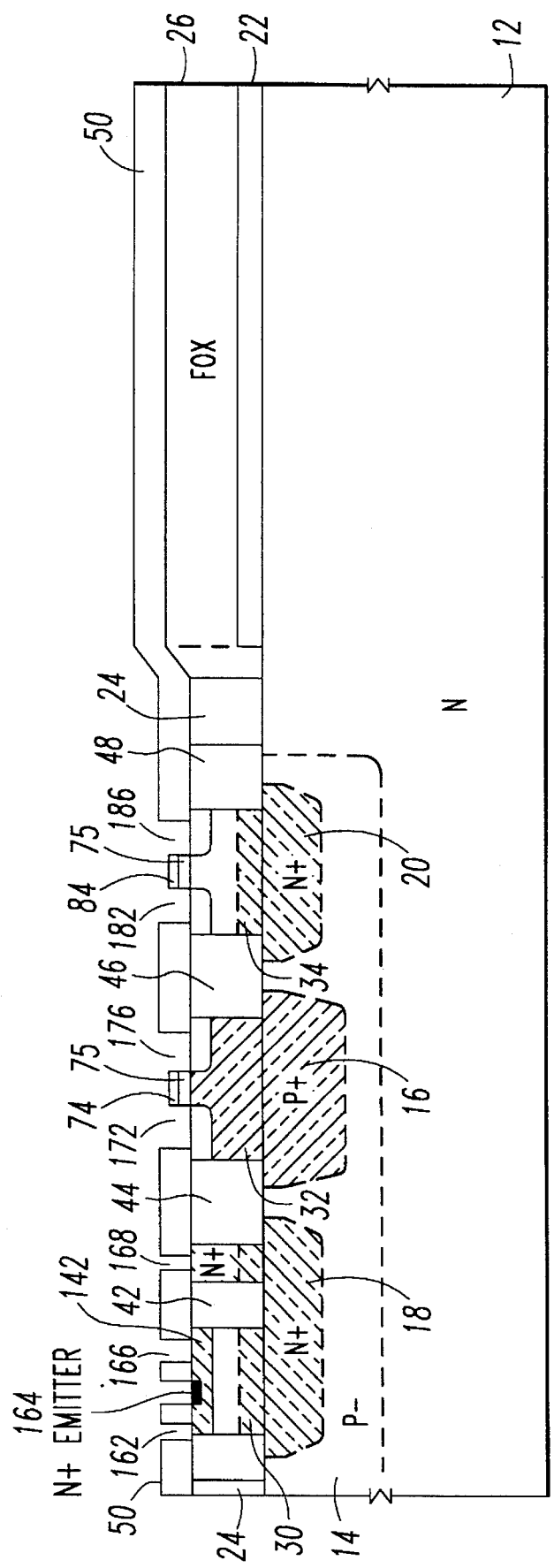

For the NPN BJT 60, shown in FIG. 1, The P– base region, designated generally by reference numeral 142 in FIG. 6, can also be formed by ion implantation in epitaxial layer 24 above N+ region 30. An N– base region for the PNP BJT can be formed, for example, by the implantation of phosphorous ions at a dosage of $2 \times 10^{13}$ and an approximate energy level of 50 keV. Boron ions at a dosage of $6 \times 10^{13}$ and an energy level of 30 keV can be implanted to form the P– base region of the NPN BJT. As shown in FIG. 7, implantation of the base region 142 is followed by the formation of a low temperature silicon dioxide (LTO) layer 50 over the surface of silicon substrate 12. The LTO layer 50 is etched to the surface of the epitaxial layer 24 to define contact windows 162, 164, 166, 168 for the NPN BJT 60, contact windows 172 and 176) for NMOS field-effect transistor 70, and contact windows 182 and 186 for PMOS field-effect transistor 80.

After formation of the contact windows, a step of ion implantation is carried out to simultaneously form N+ source contact 172 and N+ drain contact 176 for NMOS field-effect transistor 70, as well as an N+ emitter 164 for the NPN BJT 60, and a P+ base contact for the PNP BJT (not shown). This step of ion implantation can be performed, for example, with an Arsenic dosage of $5 \times 10^{15}$ at an energy level of 60 keV. Another step of ion implantation is performed to simultaneously provide a P+ source contact 182 and a P+ drain contact 186 for the PMOS field effect transistor 80, a P+ contact 166 for the NPN BJT 60, a P+ emitter contact for the PNP BJT (not shown). Formation of contacts 182, 186, 162, and 166 can be achieved, for example, by the implantation of $BF_2$ ions with a dosage of $5 \times 10^{15}$ and an energy level of 80 keV.

Formation of the contact pads is followed by the deposition of a first metal layer over the silicon substrate 12. The first metal layer may include three layers, with a bottom layer of TiW, an intermediate layer of A1, and a top layer of Ti. As shown in FIG. 1, the first metal layer is etched to define metal contacts 62, 64, 66, and 68, coupled to base contact 162, emitter contact 164, base contact 166, and collector contact 168, respectively, of BJT 60, metal contacts 72 and 76, coupled to source contact 172 and drain contact 176, respectively, of NMOS field-effect transistor 70, and metal contacts 82 and 86, coupled to source contact 182, drain contact 186, and etched gate contacts (not shown) respectively, of PMOS field-effect transistor 80. Over the first area of the silicon substrate 12, corresponding to the area over which the passive elements are formed, the first metal layer is etched to the bottom TiW layer to form a resistor 90, between drain contact 86 and a bottom plate 94 of a capacitor 100.

Capacitor 100 is formed by depositing a dielectric layer 98 of bias sputtered quartz (BSQ) silicon dioxide, for example, over the substrate 12 and etching layer 98 back to the bottom plate 94 of the capacitor. After the dielectric layer 98 is etched, the entire resultant surface of substrate 12 is covered by a layer 92 of silicon dioxide or silicon nitride for example. A second metal layer is then formed using a liftoff mask technique to form a top plate 95 of capacitor 100. Thus, the capacitor 100 constitutes a Metal-Insulator-Metal (MIM) capacitor provided by bottom plate 94, dielectric layer 92, and top plate 95. At the same time, the liftoff mask is also used to form microstrip inductor element 110 over the first area of the silicon substrate 12.

In this solution to the integration of silicon microwave BJT with low loss microwave inductors and transmission lines, the low resistivity epitaxial layer required for high frequency bipolar junction transistors (BJT's) is provided while preserving the high resistivity of the silicon substrate in the regions where the passive microwave elements (i.e. inductors, transformers, transmission lines, resistors, capacitors) are formed. Also, a near planar surface is provided to facilitate the interconnection of the BJT active devices with the isolated passive elements.

In summary, initially low temperature silicon dioxide, silicon nitride and polysilicon sub-layers forming a masking layer 22 are deposited on a high resistivity (>1000 ohm-cm) silicon substrate 12. Then a selective single crystal epitaxial layer 24, which is formed in windows cut in these thin deposited layers 22 (about 3 K angstroms total thickness) are deposited on the very high resistivity silicon substrate 12. The deposited layers 22 prevent the doped epitaxial layer from doping the high resistivity substrate in the region where the passive elements are fabricated. Further, the thin top polysilicon sub layer of the layer 22 seeds the lateral overgrowth of a continuous polysilicon layer 26 over the edge of the window and across the entire wafer. There is less than a 3 K angstrom step between the single crystal silicon layer in the windows where the BJT's will be formed and the top surface of the polysilicon layer where the passive devices will be located. To further isolate the active and passive devices, a recessed shallow trenched local oxidation of all regions outside of the active device area is accomplished. The polysilicon layer is totally oxidized. The final cross-section given in FIG. 1 shows the passive elements inductor, capacitor, transmission line positioned over the high resistivity silicon substrate; the high resistivity substrate is not doped by the epitaxial layer; active microwave bipolar devices and CMOS control logic devices are formed and isolated in the high resistivity silicon substrate; a near planar field oxide which provides dc isolation of the passive elements from the high resistivity substrate; and, the active devices are connected to the passive elements over the planar field oxide.

Having described the presently preferred embodiments of the invention, additional advantages and modifications will readily occur to those skilled in the art from consideration of the specification and practice of the invention disclosed herein. Therefore, the specification and examples should be considered as exemplary only, with the true scope and spirit of the invention being indicated by the following claims.

We claim:

1. A silicon microwave monolithic integrated circuit device comprising:

a high resistivity silicon substrate of a first conductivity type;

a masking layer formed over a first area of said substrate comprising a plurality of sub-layers of silicon dioxide atop said first area of said substrate: silicon nitride atop said silicon dioxide sub-layer: and oxidized polysilicon atop said sub-layer of silicon nitride;

a well region formed in said substrate and doped with second conductivity type dopant forming a second area of said substrate:

a silicon epitaxial layer formed over said second area of said substrate, said silicon epitaxial layer having a second resistivity lower than said high resistivity;

a microwave bipolar junction transistor (BJT) formed in said silicon epitaxial layer and a portion of said second area of said substrate; and a passive element formed over said masking layer and said first area of said silicon substrate.

2. The device of claim 1 wherein the high resistivity of the silicon substrate is at least one thousand ohms centimeter.

3. The device of claim 1 wherein the low resistivity of the silicon epitaxial layer is in the range of approximately 0.8 to 10 ohms centimeter.

4. The device of claim 1 wherein the masking layer has a thickness of approximately 3 thousand angstroms.

5. The device of claim 1 further comprising an oxide layer overlaying both the masking layer and the epitaxial layer.

* * * * *